(12) United States Patent
Ota et al.

(10) Patent No.: US 12,087,716 B2
(45) Date of Patent: Sep. 10, 2024

(54) TECHNIQUES FOR POSITIONING BOND PADS OF MICROELECTRONIC DEVICES AND RELATED MICROELECTRONIC DEVICES, METHODS, AND SYSTEMS

(71) Applicant: Micron Technology, Inc., Boise, ID (US)

(72) Inventors: Ken Ota, Kanagawa (JP); Saaya Izumi, Kanagawa (JP); Tomohiro Kitano, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 17/557,588

(22) Filed: Dec. 21, 2021

(65) Prior Publication Data

US 2023/0197651 A1 Jun. 22, 2023

(51) Int. Cl.
*H01L 23/00* (2006.01)
*H01L 25/065* (2023.01)

(52) U.S. Cl.
CPC .......... *H01L 24/06* (2013.01); *H01L 25/0657* (2013.01); *H01L 2224/06177* (2013.01); *H01L 2225/0651* (2013.01); *H01L 2225/06562* (2013.01)

(58) Field of Classification Search
CPC ............................................. H01L 2224/06177
See application file for complete search history.

(56) References Cited

U.S. PATENT DOCUMENTS

| | | | |
|---|---|---|---|
| 6,048,753 A * | 4/2000 | Farnworth | ........ H01L 23/49827 257/E21.511 |
| 6,169,331 B1 | 1/2001 | Manning et al. | |
| 6,192,578 B1 | 2/2001 | Manning et al. | |
| 6,380,635 B1 | 4/2002 | Manning et al. | |
| 6,602,778 B2 | 8/2003 | Manning et al. | |
| 8,304,337 B2 | 11/2012 | Bathan et al. | |
| 9,013,033 B2 | 4/2015 | Haba et al. | |
| 9,030,031 B2 | 5/2015 | Haba et al. | |
| 9,437,579 B2 | 9/2016 | Haba et al. | |
| 2018/0090633 A1 | 3/2018 | Cho et al. | |
| 2019/0088627 A1 | 3/2019 | Ye et al. | |
| 2022/0149010 A1* | 5/2022 | Kyung | ................... H01L 25/18 |

\* cited by examiner

*Primary Examiner* — Yu-Hsi D Sun
(74) *Attorney, Agent, or Firm* — TraskBritt

(57) ABSTRACT

Microelectronic devices may include first bond pads located proximate to, and distributed along, a first side of the microelectronic device. Other bond pads may be located proximate to, and distributed along, another side of the microelectronic device perpendicular to the first side. A first pitch of the first bond pads may be greater than another pitch of the other bond pads. When microelectronic devices are placed side by side, the bond pads on sides of the microelectronic devices proximate to one another may be interposed between one another in the direction parallel to the first shortest distance between adjacent first bond pads.

20 Claims, 4 Drawing Sheets

TECHNIQUES FOR POSITIONING BOND PADS OF MICROELECTRONIC DEVICES AND RELATED MICROELECTRONIC DEVICES, METHODS, AND SYSTEMS

FIELD

This disclosure relates generally to positions and configurations for bond pads of microelectronic devices. More specifically, disclosed embodiments relate to microelectronic devices that may, in comparison to conventional microelectronic devices, be more easily deployable in multi-device products, may improve signal quality, may improve power delivery, and may reduce the risk of shorting connections within the microelectronic devices.

BACKGROUND

Wire bonds may be used to electrically connect a microelectronic device to a substrate. For example, a microelectronic device may be positioned on or above a substrate, with bond pads of the microelectronic device exposed on a side of the microelectronic device opposite the substrate. Wire bonds may extend from the bond pads to lands on a surface of the substrate facing the microelectronic device to electrically connect the microelectronic device to the substrate.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

DETAILED DESCRIPTION

Figure 1:
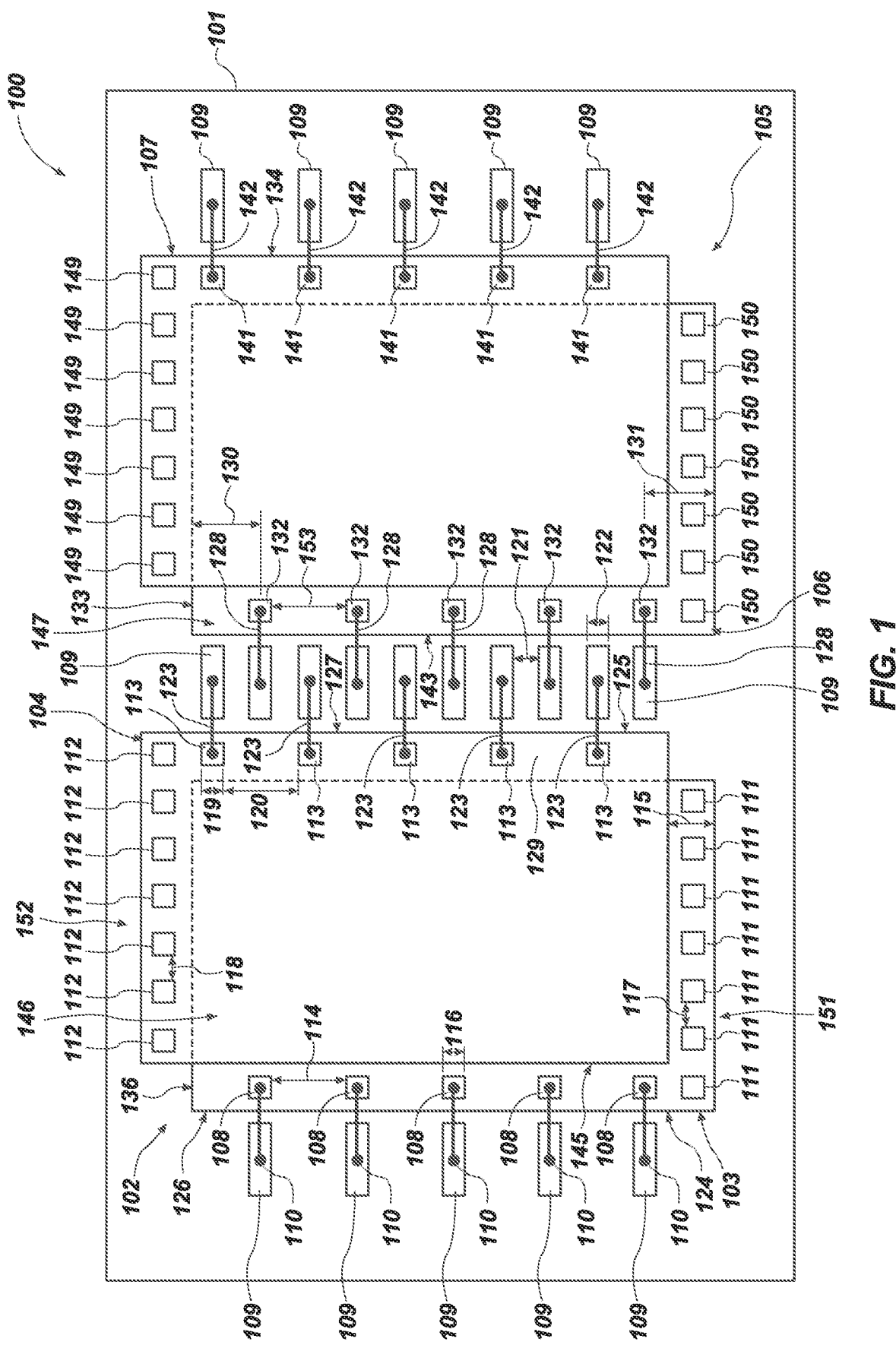
FIG. 1 is a surface plan view of a schematic depicting a microelectronic device package including multiple microelectronic devices, in accordance with this disclosure.

The illustrations presented in this disclosure are not meant to be actual views of any particular microelectronic device, microelectronic device package, or component thereof, but are merely idealized representations employed to describe illustrative embodiments. Thus, the drawings are not necessarily to scale.

Disclosed embodiments relate generally to microelectronic devices that may be more easily deployable in multi-device products, may improve signal quality, may increase signal density, may improve power delivery, and may reduce the risk of shorting connections within the microelectronic devices. More specifically, disclosed are embodiments of microelectronic devices including bond pads located along at least two opposite sides of the microelectronic devices. The bond pads on the opposite sides of a given microelectronic device may be offset from one another. When the microelectronic device is oriented such that the opposite sides are located to the left and right, for example, the bond pads on the left may be offset upward or downward, and the bond pads on the right may be offset downward or upward, whichever results in a horizontal line intersecting a bond pad on only one side of the microelectronic device.

When multiple such microelectronic devices are deployed in a shared package, the microelectronic devices may be placed in a side-by-side configuration. The bond pads on the sides of the microelectronic devices proximate to one another may be offset from one another. Lands of a substrate to which the microelectronic devices may be connected may be interposed between the microelectronic devices, and may have a pitch greater than (e.g., approximately double) a pitch of the bond pads. Sequential lands may be connected to bond pads of alternating microelectronic devices by wire bonds.

Such an arrangement for the bond pads, and configuration for connecting the bond pads to the substrate, may enable the microelectronic devices to be deployed at greater density. For example, a single-width row of lands may be connected to multiple microelectronic devices, reducing a lateral footprint of the resulting package and enabling denser microelectronic device deployment in at least some examples.

In some examples, a given microelectronic device may include bond pads located adjacent to one or more additional sides. For example, a row of bond pads may be located along a top side, a bottom side, or a top side and a bottom side when the associated microelectronic device is oriented with the offset bond pads to the left and right. The additional bond pads may not be offset from one another in some such examples. The additional bond pads may also be positioned at a smaller pitch than the offset bond pads. For example, one, some, or all of the bond pads located along the top side may be at least substantially aligned with corresponding ones of the bond pads located along the bottom side. In some examples where the microelectronic device includes the offset bond pads and additional bond pads along another side, the row of lands connected to the offset bond pads may be configured to connect the microelectronic device(s) to a reference voltage, and other lands connected to the other bond pads may be configured to connect the microelectronic device(s) to a data signal and/or clock channel. Arrangements for the bond pads configured to segregate power from data signal and clock channels may improve signal quality and may reduce resistance, improving power delivery.

In some examples, the wire bonds may be oriented at least substantially perpendicular to a closest edge of the associated microelectronic device when viewed in a direction perpendicular to a major surface where the offset bond pads are located. For example, the relative positions of the bond pads on the microelectronic device and the lands on a substrate to be connected to one another may enable the wire bonds to extend along an at least substantially direct path from the bond pads to the associated lands. More specifically, the relative positions of the bond pads on the microelectronic device and the lands on a substrate to be connected to one another may enable the wire bonds not to cross paths when extending from the bond pads to the lands. As specific, nonlimiting examples, the microelectronic device may be free of wire bonds that cross paths, or an entire microelectronic device package may be free of wire bonds that cross paths. Such a layout for the bond pads, lands, and wire bonds may reduce the risk of shorts between wire bonds or between a wire bond and another structure of the microelectronic device or substrate.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

FIG. 1 is a surface plan view of a schematic depicting a microelectronic device package 100 including multiple microelectronic devices 103, 104, 106, 107. For example, the microelectronic device package 100 may include a first stack of microelectronic devices 102 including at least a first microelectronic device 103 and a second microelectronic device 104 overlying the second microelectronic device 104; and a second stack of microelectronic devices 105 including at least a third microelectronic device 106 and a fourth microelectronic device 107 overlying the third microelectronic device 106. The first microelectronic device 103 may be offset laterally and longitudinally with respect to the second microelectronic device 104 in the first stack of microelectronic devices 102. For example, a region of a first major surface 145 of the first microelectronic device 103 facing the second microelectronic device 104 and having a general "L" shape may be exposed beyond a periphery (e.g., outermost boundary) of the second microelectronic device 104. The third microelectronic device 106 may likewise be laterally and longitudinally offset with respect to the fourth microelectronic device 107. For example, a region of another first major surface 147 of the third microelectronic device 106 facing the fourth microelectronic device 107 and having a general "L" shape may be exposed beyond a periphery of the fourth microelectronic device 107.

The first microelectronic device 103 may include, for example, first bond pads 108 located proximate to, distributed along, and extending along at least substantially an entirety of, a first side 124 of the first stack of microelectronic devices 102. For example, the first microelectronic device 103 may generally be shaped as a rectangular prism, and the first bond pads 108 may be located in a first row proximate to, and extending along, a first edge 126 defined between the first major surface 145 of the first microelectronic device 103 and a lateral side surface of the first microelectronic device 103, when viewed in the orientation of FIG. 1. The first bond pads 108 may be located outside of a lateral area of the second microelectronic device 104 and may be accessible on the first major surface 145 of the first microelectronic device 103 for formation of electrical connections and routing of signals and/or power to the first microelectronic device 103. Second bond pads 113 of the second microelectronic device 104 may be located proximate to, distributed along, and extend along at least substantially an entirety of, a second, opposite side 125 of the first stack of microelectronic devices 102. For example, the second microelectronic device 104 may be shaped as a rectangular prism, the second bond pads 113 may be located in a second row proximate to, and extending along, a second edge 127 defined between a second major surface 146 of the second microelectronic device 104 and another, opposite lateral side surface of the microelectronic device 202, when viewed in the orientation of FIG. 1. The second major surface 146 of the second microelectronic device 104 may be located on a side of the second microelectronic device 104 opposite the first microelectronic device 103.

The first bond pads 108 and the second bond pads 113 may be offset from one another in a direction parallel to a first shortest distance 114 between adjacent first bond pads 108. For example, a line extending perpendicular to the first shortest distance 114 between adjacent first bond pads 108, and intersecting a geometric center of a given first bond pad 108 or second bond pad 113, may not intersect with a geometric center of any other first bond pad 108 or second bond pad 113 of the first stack of microelectronic devices 102, as viewed in the orientation of FIG. 1. More specifically, a line extending perpendicular to the first shortest distance 114 between adjacent first bond pads 108, and intersecting a geometric center of a given first bond pad 108 or second bond pad 113, may not intersect with any other first bond pad 108 or second bond pad 113 of the first stack of microelectronic devices 102 when viewed in a direction perpendicular to the first major surface 145 of the first microelectronic device 103. As a specific, nonlimiting example, a line extending perpendicular to the between adjacent first bond pads 108, and intersecting a given first bond pad 108 or second bond pad 113 at any point, may not intersect with any other first bond pad 108 or second bond pad 113 of the first stack of microelectronic devices 102. The offset of the other first bond pads 132 and the other second bond pads 141 may be at least substantially the same as described above in connection with the first bond pads 108 and the second bond pads 113.

In some examples, the offset of the first bond pads 108 and the second bond pads 113 relative to one another may result in the first bond pads 108 and the second bond pads 113 alternating with one another with distance, as measured in a direction parallel to the first shortest distance 114 between adjacent first bond pads 108. For example, one of the first bond pad 108 of the first microelectronic device 103 may be interposed between each adjacent pair of the second bond pads 113 of the second microelectronic device 104 and one of the second bond pads 113 may be interposed between each adjacent pair of the first bond pads 108, with distance along a direction parallel to the first shortest distance 114 between adjacent first bond pads 108. More specifically, as distance along a direction parallel to the first shortest distance 114 between adjacent first bond pads 108 increases, a first bond pad 108 or second bond pad 113 intersected by a line perpendicular to the first shortest distance 114 between adjacent first bond pads 108 may alternate between a given first bond pad 108 proximate to the first side 124 and a given second bond pad 113 proximate to the second side 125.

The first shortest distance 114 between adjacent first bond pads 108 may be greater than a greatest first width 116 of each one of the first bond pads 108, as measured in the direction parallel to the first shortest distance 114 in some examples. For example, the first shortest distance 114 between adjacent first bond pads 108 may be between about 1.1 times and about 10 times the greatest first width 116 of any one of the first bond pads 108. More specifically, the first shortest distance 114 between adjacent first bond pads 108 may be, for example, between about 1.5 times and about 7.5 times the greatest first width 116 of any one of the first bond pads 108. As a specific, nonlimiting example, the first shortest distance 114 between adjacent first bond pads 108 may be between about 2 times and about 5 times (e.g., about 2.5 times, about 3 times, about 4 times) the greatest first width 116 of any one of the first bond pads 108. In some examples, the spacing between adjacent second bond pads 113 may be at least substantially the same as, though offset from, the spacing for the first bond pads 108. For example, a second shortest distance 120 between adjacent second bond pads 113 may be greater than a greatest second width 119 of any one of the second bond pads 113, as measured in the direction parallel to the first shortest distance 114.

In some examples, the first stack of microelectronic devices 102 may include bond pads proximate to, and extending along, more than two sides of the first stack of microelectronic devices 102. For example, the first microelectronic device 103 of the first stack of microelectronic devices 102 may include third bond pads 111 located proximate to, distributed along, and extending along at least substantially an entirety of, a third side 151 of the first stack of microelectronic devices 102. The third side 151 may extend between the first side 124 and the second side 125. The third side 151 may be, for example, perpendicular to, and intersect with, the first edge 126 and may extend from the first edge 126 toward second side 125 of the second microelectronic device 104. As another example, the first stack of microelectronic devices 102 may include fourth bond pads 112 located proximate to, distributed along, and extending along at least substantially an entirety of, a fourth side 152 of the first stack of microelectronic devices 102. The fourth side 152 may be located opposite the third side 151. For example, the fourth side 152 may be perpendicular to, and intersect with, the second edge 127 and may extend from a second edge 127 located at the second side 125 of the second microelectronic device 104 toward the first side 124. In some examples, the first stack of microelectronic devices 102 may include bond pads proximate to, and extending along, each side of the first stack of microelectronic devices 102. For example, the first stack of microelectronic devices 102 may include the third bond pads 111 of the first microelectronic device 103 located proximate to, and distributed along, the third side 151 of the first stack of microelectronic devices 102 and the fourth bond pads 112 of the second microelectronic device 104 located proximate to, and distributed along, the fourth side 152 of the first stack of microelectronic devices 102.

One of the third bond pads 111 may be at least substantially aligned with a corresponding one of the fourth bond pads 112 in another direction at least substantially parallel to the first shortest distance 114 in some examples where the first stack of microelectronic devices 102 includes the third bond pads 111 and the fourth bond pads 112. For example, a majority of the third bond pads 111 may be aligned with corresponding ones of the fourth bond pads 112, representing a majority of the fourth bond pads 112 in the direction parallel to the first shortest distance 114. More specifically, all but one of the third bond pads 111 may be aligned with corresponding ones of the fourth bond pads 112, with the remaining third bond pad 111 being aligned with the second bond pads 113 and a remaining fourth bond pad 112 being aligned with the first bond pads 108 in the direction parallel to the first shortest distance 114.

A first pitch of the first bond pads 108 may be greater than a third pitch of the third bond pads 111 in those examples where the first microelectronic device 103 of the first stack of microelectronic devices 102 includes the third bond pads 111. The first pitch may be measured from geometric center to geometric center of adjacent first bond pads 108, and may be, for example, at least substantially equal to a corresponding second pitch 129 of the second bond pads 113. For example, the first shortest distance 114 between adjacent first bond pads 108 may be between about 1.1 times and about 10 times a third shortest distance 118 between adjacent third bond pads 111. More specifically, the first shortest distances 114 between adjacent first bond pads 108 may be, for example, between about 1.5 times and about 7.5 times the third shortest distance 118 between adjacent third bond pads 111. As a specific, nonlimiting example, the first shortest distance 114 between adjacent first bond pads 108 may be between about 2 times and about 5 times (e.g., about 2.5 times, about 3 times, about 4 times) the third shortest distance 118 between adjacent third bond pads 111.

The first pitch of the first bond pads 108 may also be greater than a fourth pitch of the fourth bond pads 112 in those examples where the second microelectronic device 104 of the first stack of microelectronic devices 102 includes the fourth bond pads 112. For example, the first shortest distance 114 between adjacent first bond pads 108 may be between about 1.1 times and about 10 times a fourth shortest distance 117 between adjacent fourth bond pads 112. More specifically, the first shortest distance 114 between adjacent first bond pads 108 may be, for example, between about 1.5 times and about 7.5 times the fourth shortest distance 117 between adjacent fourth bond pads 112. As a specific, nonlimiting example, the first shortest distance 114 between adjacent first bond pads 108 may be between about 2 times and about 5 times (e.g., about 2.5 times, about 3 times, about 4 times) the fourth shortest distance 117 between adjacent fourth bond pads 112.

Each of the first microelectronic device 103 and the second microelectronic device 104 of the first stack of microelectronic devices 102 may include, for example, a respective die bearing circuitry connected to the bond pads, with the bond pads being used to connect the circuitry of the die to higher-level packaging. For example, each of the first microelectronic device 103 and the second microelectronic device 104 of the first stack of microelectronic devices 102 may include a die having a first major surface 145 or a second major surface 146 (e.g., an active surface) at which the first bond pads 108, the second bond pads 113, any third bond pads 111, and any fourth bond pads 112 may be at least temporarily exposed for connecting the first microelectronic device 103 and the second microelectronic device 104 of the first stack of microelectronic devices 102 to higher-level packaging (any bond pads may subsequently be covered by, for example, an encapsulant material). More specifically, each of the first microelectronic device 103 and the second microelectronic device 104 of the first stack of microelectronic devices 102 may include, for example, a die 236 including a semiconductor material having integrated circuitry connected to the bond pads of the respective first microelectronic device 103 or second microelectronic device 104 of the first stack of microelectronic devices 102.

At least some of the first bond pads 108 and the second bond pads 113 may be configured for connection to a reference voltage in some examples. For example, the first stack of microelectronic devices 102 may be supported on a substrate 101, and the first bond pads 108 and the second bond pads 113 may be connected to respective lands 109 of the substrate 101, which may in turn be connected to a power source. More specifically, the first stack of microelectronic devices 102 may be interposed between at least two rows of lands 109, the first bond pads 108 of the first microelectronic device 103 of the first stack of microelectronic devices 102 may be connected to lands 109 located proximate to the first side 124 of the first stack of microelectronic devices 102 by first wire bonds 110, and the second bond pads 113 of the second microelectronic device 104 of the first stack of microelectronic devices 102 may be connected to lands 109 located proximate to the second side 125 of the first stack of microelectronic devices 102 by second wire bonds 123.

In some examples, at least some of the third bond pads 111 and the fourth bond pads 112 may be configured for connection to a data signal or clock channel. For example, the third bond pads 111 and the fourth bond pads 112 may be connected to respective lands 109 of the substrate 101, which may in turn be connected to data signal or clock channel. More specifically, the first stack of microelectronic devices 102 may be at least substantially surrounded by lands 109, the first bond pads 108 of the first microelectronic device 103 may be connected to lands 109 located proximate to the first side 124 of the first stack of microelectronic devices 102 by first wire bonds 110, the second bond pads 113 of the second microelectronic device 104 may be connected to lands 109 located proximate to the second side 125 of the first stack of microelectronic devices 102 by second wire bonds 123, and the third bond pads 111 and fourth bond pads 112 may be connected to lands 109 proximate to the third side 151 and the fourth side 152, respectively, by wire bonds. For the sake of simplicity, the lands and wire bonds for connecting the third bond pads 111 and the fourth bond pads 112 to the substrate 101 are not depicted in FIG. 1. Providing bond pads along multiple sides of a given stack of microelectronic devices, including along each side of the stack and along two sides of each microelectronic device in the stack, may increase the number of available connections, increase signal density, and improve power delivery, enabling use of stacks of microelectronic devices having greater numbers of discrete outputs, requiring greater power throughput, relying on a greater number of different reference voltages, or having any combination of these characteristics.

By segregating the connections to power from the connections to data signal and clock channels, signal quality may be improved. For example, connecting to power from two opposite sides of a first stack of microelectronic devices 102, and connecting to data signal and clock channel from two other opposite sides of the first stack of microelectronic devices 102 may reduce the risk of interaction between the power and data signal and clock channels. More specifically, positioning the bond pads of the microelectronic device package 100 to generally facilitate routing power in a direction perpendicular to a direction in which data signal and clock channels are routed in a given microelectronic device within the microelectronic device package 100 may reduce interaction between the power and data signal and clock channels, improving signal quality.

An offset between the first microelectronic device 103 and the second microelectronic device 104 in the first stack of microelectronic devices 102 may be sufficient to ensure that any wire-bond-forming apparatus can access and form bonds with bond pads of the underlying microelectronic device, which is first microelectronic device 103 in FIG. 1. For example, an overhang distance 115, as measured between a periphery of the second microelectronic device 104 and the periphery of the first microelectronic device 103 on the first side 124 or the third side 151, may be determined based, at least in part, on a pitch 129 of the first bond pads 108 and the second bond pads 113. More specifically, the overhang distance 115 may be equal to two times the number of first bond pads 108 or second bond pads 113 plus one, multiplied by the pitch 129 of the first bond pads 108 or the second bond pads 113, less a first offset 130 between a fourth edge 136 of the first microelectronic device 103 proximate to the fourth side 152 of the first stack of microelectronic devices 102 and a geometric center of a closest first bond pad 108, as measured in a direction parallel to the first shortest distance 114, plus a second offset 131 between the third side 151 of the first microelectronic device 103 and a geometric center of a closest first bond pad 108, as measured in the direction parallel to the first shortest distance 114. As a specific, nonlimiting example, the overhang distance 115 may be determined utilizing the following formula:

First Offset 130+Overhang Distance 115−Second Offset 131=(2n+1)*Pitch 129, where n is a natural number or zero. Providing adequate space on the first major surface 145 of the first microelectronic device 103 located beyond the periphery of the second microelectronic device 104 may reduce the risk that the wire-bond-forming apparatus may make unintended contact with the first microelectronic device 103 or the second microelectronic device 104 and that the wire-bond-forming apparatus may fail to make connections with the first bond pads 108 and/or the third bond pads 111.

The microelectronic device package 100 may include a second stack of microelectronic devices 105 supported on the substrate 101 with the first stack of microelectronic devices 102, in some examples. The second stack of microelectronic devices 105 may be configured in a manner at least substantially similar to the first stack of microelectronic devices 102, insofar as position and distribution of bond pads may be concerned. For example, the second stack of microelectronic devices 105 may include a third microelectronic device 106 having other first bond pads 132 located proximate to, and distributed along, another first side 124 of the second stack of microelectronic devices 105. A fourth microelectronic device 107 stacked above the third microelectronic device 106 may include other second bond pads 141 located proximate to, and distributed along, another second, opposite side 134 of the second stack of microelectronic devices 105.

The other first bond pads 132 and the other second bond pads 141 may be offset from one another in a direction parallel to another first shortest distance 153 between adjacent other first bond pads 132. For example, a line extending perpendicular to the other first shortest distance 153 between adjacent other first bond pads 132, and intersecting a geometric center of a given other first bond pad 132 or other second bond pad 141, may not intersect with a geometric center of any other first bond pad 132 or other second bond pad 141 of the second stack of microelectronic devices 105, as viewed in the orientation of FIG. 1. More specifically, a line extending perpendicular to the other first shortest distance 153 between adjacent other first bond pads 132, and intersecting a geometric center of a given other first bond pad 132 or other second bond pad 141, may not intersect with any other first bond pad 132 or other second bond pad 141 of the second stack of microelectronic devices 105. As a specific, nonlimiting example, a line extending perpendicular to the other first shortest distance 153 between adjacent other first bond pads 132, and intersecting a given other first bond pad 132 or other second bond pad 141 at any point, may not intersect with any other first bond pad 132 or other second bond pad 141 of the second stack of microelectronic devices 105.

In some examples, the offset of the other first bond pads 132 and the other second bond pads 141 relative to one another may result in the other first bond pads 132 and the other second bond pads 141 alternating with one another with distance, as measured in a direction parallel to the other first shortest distance 153 between adjacent other first bond pads 132. For example, one of the other first bond pads 132 of the third microelectronic device 106 of the second stack of microelectronic devices 105 may be interposed between each adjacent pair of the other second bond pads 141 of the fourth microelectronic device 107 of the second stack of microelectronic devices 105 and one of the other second bond pads 141 may be interposed between each adjacent pair of the other first bond pads 132, with distance along a direction parallel to the other first shortest distance 153 between adjacent other first bond pads 132. More specifically, as distance along a direction parallel to the other first shortest distance 153 between adjacent other first bond pads 132 increases, an other first bond pad 132 or other second bond pad 141 intersected by a line perpendicular to the other first shortest distance 153 between adjacent other first bond pads 132 may alternate between a given other first bond pad 132 proximate to the other first side 133 and a given other second bond pad 141 proximate to the other second side 134 of the second stack of microelectronic devices 105.

Each of the third microelectronic device 106 and the fourth microelectronic device 107 of the second stack of microelectronic devices 105 may include, for example, another respective die bearing circuitry connected to the bond pads, with the bond pads being used to connect the circuitry of each other die to higher-level packaging. For example, the third microelectronic device 106 of the second stack of microelectronic devices 105 may include another die having a third major surface (e.g., an active surface) at which the other first bond pads 132 and any other third bond pads 149 may be at least temporarily exposed for connecting the third microelectronic device 106 of the second stack of microelectronic devices 105 to higher-level packaging (any bond pads may subsequently be covered by, for example, an encapsulant material). Continuing the example, the fourth microelectronic device 107 of the second stack of microelectronic devices 105 may include yet another die having a fourth major surface (e.g., an active surface) at which the other second bond pads 141 and any other fourth bond pads 150 may be at least temporarily exposed for connecting the fourth microelectronic device 107 of the second stack of microelectronic devices 105 to higher-level packaging (any bond pads may subsequently be covered by, for example, an encapsulant material). More specifically, each of the third microelectronic device 106 and the fourth microelectronic device 107 of the second stack of microelectronic devices 105 may include, for example, another respective die including a semiconductor material having integrated circuitry connected to the bond pads of the second stack of microelectronic devices 105.

In some examples, some of the first bond pads 108 of the first stack of microelectronic devices 102 may be interposed between corresponding ones of the other second bond pads 141 of the second stack of microelectronic devices 105 in the direction parallel with the first shortest distance 114 between adjacent first bond pads 108, or some of the second bond pads 113 of the first stack of microelectronic devices 102 may be interposed between corresponding ones of the other first bond pads 132 of the second stack of microelectronic devices 105. As shown in FIG. 1, the second side 125 of the first stack of microelectronic devices 102 may face, and be located proximate to, the other first side 133 of the second stack of microelectronic devices 105. As distance along the direction parallel to the first shortest distance 114 between adjacent first bond pads 108 increases, a line perpendicular to the first shortest distance 114 between adjacent first bond pads 108 may alternate between intersecting a given second bond pad 113 proximate to the second side 125 and a given other first bond pad 132 proximate to the other first side 133.

Each successive land 109 interposed between the second stack of microelectronic devices 105 and the second stack of microelectronic devices 105 may likewise be connected to an alternating one of the second bond pads 113 or the other first bond pads 132. For example, a single row of mutually aligned lands 109 may be located between the first stack of microelectronic devices 102 and the second stack of microelectronic devices 105, and alternating ones of the second wire bonds 123 or the other first wire bonds 128 may extend from successive lands 109 to corresponding alternating ones of the second bond pads 113 or the other first bond pads 132.

The first bond pads 108 of the first stack of microelectronic devices 102 may be at least substantially aligned with the other first bond pads 132 of the second stack of microelectronic devices 105 along the direction parallel to the first shortest distance 114 between adjacent first bond pads 108, and the second bond pads 113 of the first stack of microelectronic devices 102 may be at least substantially aligned with the other second bond pads 141 of the second stack of microelectronic devices 105 along the same direction. For example, a line perpendicular to the first shortest distance 114 between adjacent first bond pads 108, and intersecting a given first bond pad 108, may also intersect with a corresponding one of the other first bond pads 132. More specifically, for each first bond pad 108, a line perpendicular to the first shortest distance 114 between adjacent first bond pads 108, and intersecting a given first bond pad 108, may also intersect with a corresponding one of the other first bond pads 132. Continuing the example, the line perpendicular to the first shortest distance 114 between adjacent first bond pads 108, and intersecting a given second bond pad 113, may also intersect with a corresponding one of the other second bond pads 141. More specifically, for each second bond pads 113, the line perpendicular to the first shortest distance 114 between adjacent first bond pads 108, and intersecting a given second bond pad 113, may also intersect with a corresponding one of the other second bond pads 141.

The other first wire bonds 128 may extend from the other first bond pads 132 of the third microelectronic device 106 of the second stack of microelectronic devices 105 in a first direction, and second wire bonds 123 may extend from the second bond pads 113 of the second microelectronic device 104 of the first stack of microelectronic devices 102 in a second, opposite direction. The other first wire bonds 128 and the second wire bonds 123 may extend to corresponding lands 109 of the substrate 101 interposed between the first stack of microelectronic devices 102 and the second stack of microelectronic devices 105. The other first wire bonds 128 may alternate with the second wire bonds 123 along the direction parallel to the first shortest distance 114 between the adjacent first bond pads 108. As distance along the direction parallel to the first shortest distance 114 between adjacent first bond pads 108 increases, for example, a line perpendicular to the first shortest distance 114 between adjacent first bond pads 108 may alternate between intersecting a given other first wire bond 128 or a given second wire bond 123.

A first pitch of the first bond pads 108 of the first stack of microelectronic devices 102 may be greater than a second pitch of the lands 109 of the substrate 101 between the first stack of microelectronic devices 102 and the second stack of microelectronic devices 105. For example, the first shortest distance 216 between adjacent first bond pads 204 may be between about 1.5 times and about 5 times a fifth shortest distance 121 between adjacent lands 242 located between the first stack of microelectronic devices 102 and the second stack of microelectronic devices 105. More specifically, the first shortest distance 114 between adjacent first bond pads 108 may be, for example, between about 2 times and about 4 times the fifth shortest distance 121 between adjacent lands 109 located between the first stack of microelectronic devices 102 and the second stack of microelectronic devices 105. As a specific, nonlimiting example, the first shortest distance 114 between adjacent first bond pads 108 may be about 3 times the fifth shortest distance 121 between adjacent lands 109 located between the first stack of microelectronic devices 102 and the second stack of microelectronic devices 105.

Like the first bond pads 108 of the first microelectronic device 103 and the second bond pads 113 of the second microelectronic device 104 of the first stack of microelectronic devices 102, at least some of the other first bond pads 132 of the third microelectronic device 106 and the other second bond pads 141 of the fourth microelectronic device 107 of the second stack of microelectronic devices 105 may be configured for connection to a reference voltage via the lands 109 of the substrate 101.

Distances between offset bond pads of the first stack of microelectronic devices 102 and the second stack of microelectronic devices 105 may be greater than the sizes of the lands 109 in at least some directions. For example, a second shortest distance 120 between adjacent second bond pads 113 of the first stack of microelectronic devices 102 may be greater than a greatest other width 122 of each one of the lands 109, as measured in the direction parallel to the first shortest distance 114 between adjacent first bond pads 108. More specifically the second shortest distance 120 between adjacent second bond pads 113 may be between about 1.5 times and about 5 times a greatest other width 122 of the lands 109. As a specific, nonlimiting example, the second shortest distance 120 between adjacent second bond pads 113 may be, for example, between about 2 times and about 4 times (e.g., about 3 times) the greatest other width 122 of the lands 109.

Positioning the bond pads of the first stack of microelectronic devices 102 and the second stack of microelectronic devices 105, and the lands 109 of the substrate 101, in accordance with this disclosure may enable wire bonds to take a more direct path from the bond pads to the lands 109. For example, the other first wire bonds 128 may extend at least substantially perpendicular to the other first edge 143 of the third microelectronic device 106 of the second stack of microelectronic devices 105, the other first edge 143 located proximate to the other first bond pads 132. The second wire bonds 123 may also extend at least substantially perpendicular to a second edge 127 of the second microelectronic device 104 of the first stack of microelectronic devices 102, the second edge 127 located proximate to the second bond pads 113.

In some examples, the first stack of microelectronic devices 102 and the second stack of microelectronic devices 105 may be free of wire bonds crossing one another. For example, the first wire bonds 110 extending between respective ones of the first bond pads 108 and the lands 109 may not cross one another, or any other wire bonds of the microelectronic device package 100, when viewed in a direction perpendicular to the first major surface 145 of the first microelectronic device 103 of the first stack of microelectronic devices 102. Similarly, the second wire bonds 123 extending between respective ones of the second bond pads 113 and the lands 109, the other first wire bonds 128 extending between respective ones of the other first bond pads 132 and the lands 109, and the other second wire bonds 142 extending between respective ones of the other second bond pads 141 and the lands 109 may not cross one another, or any other wire bonds of the microelectronic device package 100, when viewed in a direction perpendicular to the first major surface 145 of the first microelectronic device 103 of the first stack of microelectronic devices 102. Layouts for bond pads and associated lands in accordance with this disclosure may enable more direct pathing for wire bonds extending therebetween, reducing the risk of undesirable contact between wire bonds themselves or between the wire bonds and other structures within the package (e.g., with the microelectronic devices).

The bond pads of the microelectronic device package 100 (e.g., first bond pads 108, second bond pads 113, other first bond pads 132, other second bond pads 141) may be configured as discrete regions of electrically conductive material connected to circuitry of the relevant first microelectronic device 103 or second microelectronic device 104 of the first stack of microelectronic devices 102 or third microelectronic device 106 or fourth microelectronic device 107 of the second stack of microelectronic devices 105 and positioned for connection to higher-level packaging. For example, the bond pads of the microelectronic device package 100 may include surfaces of electrically conductive material (e.g., copper, aluminum, gold, tin, lead, alloys and mixtures including the foregoing) supported on the die of the relevant first microelectronic device 103 or second microelectronic device 104 of the first stack of microelectronic devices 102 or third microelectronic device 106 or fourth microelectronic device 107 of the second stack of microelectronic devices 105. More specifically, the bond pads of the microelectronic device package 100 may be formed in uppermost layers of an interconnect structure of each die of the relevant first microelectronic device 103 or second microelectronic device 104 of the first stack of microelectronic devices 102 or third microelectronic device 106 or fourth microelectronic device 107 of the second stack of microelectronic devices 105.

The lands 109 of the substrate 101 may similarly be configured as discrete regions of electrically conductive material connected to routing connections of the substrate 101. For example, the lands 109 of the substrate 101 may include surfaces of electrically conductive material (e.g., copper, aluminum, gold, tin, lead, alloys and mixtures including the foregoing) supported on the substrate 101. More specifically, the lands 109 of the substrate 101 may be located on a side facing the microelectronic devices of the microelectronic device package 100, and the substrate 101 may include, for example, redistribution layers, electrically conductive vias, traces, and other electrically conductive routing connections for routing power, data signal, and clock channels to and from the microelectronic devices.

The wire bonds of the microelectronic device package 100 (e.g., first wire bonds 110, second wire bonds 123, other first wire bonds 128, other second wire bonds 142, wire bonds for the third bond pads 111, fourth bond pads 112, other third bond pads 149, other fourth bond pads 150) may be configured as elongated masses of electrically conductive material extending between the bond pads and the lands 109 of the microelectronic device package 100. For example, the wire bonds may have a length to width ratio of 10 or higher, and may include electrically conductive material (e.g., copper, aluminum, gold, tin, lead, alloys and mixtures including the foregoing) for interconnecting the bond pads and the lands 109.

In summary, microelectronic devices in accordance with this disclosure may include first bond pads located proximate to, and distributed along, a first side of the microelectronic device. Other bond pads may be located proximate to, and distributed along, another side of the microelectronic device oriented perpendicular to the first side. A first pitch of the first bond pads may be greater than another pitch of the other bond pads.

Figure 2:
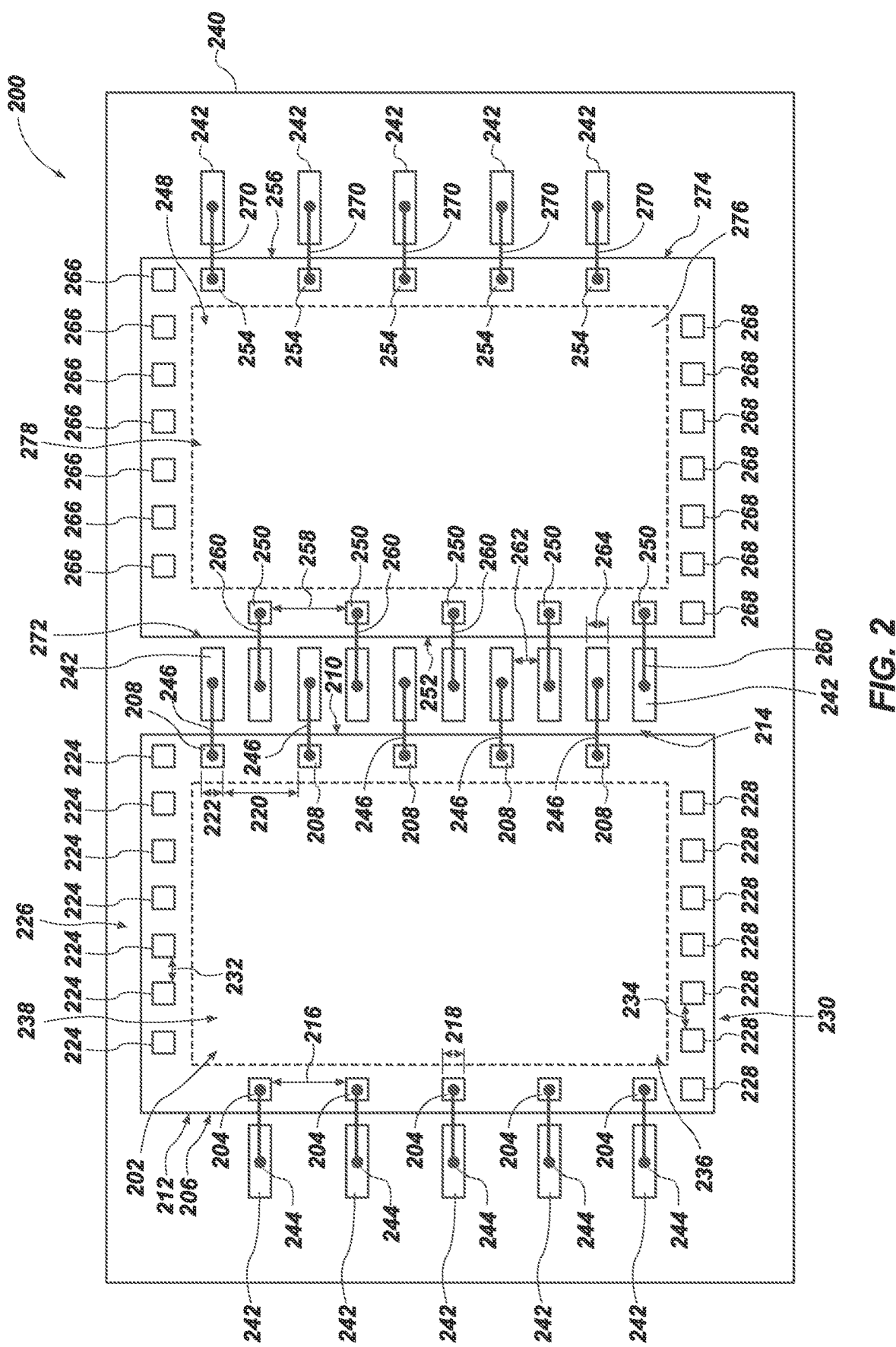
FIG. 2 is a surface plan view of a schematic depicting an additional microelectronic device package including multiple microelectronic devices, in accordance with this disclosure.

FIG. 2 is a surface plan view of a schematic depicting a microelectronic device package 200 including multiple microelectronic devices 202, 248. A given microelectronic device 202 may include, for example, first bond pads 204 located proximate to, and distributed along, a first side 206 of the microelectronic device 202. For example, the microelectronic device 202 may generally be shaped as a rectangular prism, and the first bond pads 204 may be located in a first row proximate to, and extending along, a first edge 212 defined between a first major surface 238 of the microelectronic device 202 and a lateral side surface of the microelectronic device 202, when viewed in the orientation of FIG. 2. Second bond pads 208 of the microelectronic device 202 may be located proximate to, and distributed along, a second, opposite side 210 of the microelectronic device 202. Continuing the example where the microelectronic device 202 may be shaped as a rectangular prism, the second bond pads 208 may be located in a second row proximate to, and extending along, a second edge 214 defined between the first major surface 238 of the microelectronic device 202 and another, opposite lateral side surface of the microelectronic device 202, when viewed in the orientation of FIG. 2.

The first bond pads 204 and the second bond pads 208 may be offset from one another in a direction parallel to a first shortest distance 216 between adjacent first bond pads 204. For example, a line extending perpendicular to the first shortest distance 216 between adjacent first bond pads 204, and intersecting a geometric center of a given first bond pad 204 or second bond pad 208, may not intersect with a geometric center of any other first bond pad 204 or second bond pad 208 of the microelectronic device 202. More specifically, a line extending perpendicular to the first shortest distance 216 between adjacent first bond pads 204, and intersecting a geometric center of a given first bond pad 204 or second bond pad 208, may not intersect with any other first bond pad 204 or second bond pad 208 of the microelectronic device 202. As a specific, nonlimiting example, a line extending perpendicular to the first shortest distance 216 between adjacent first bond pads 204, and intersecting a given first bond pad 204 or second bond pad 208 at any point, may not intersect with any other first bond pad 204 or second bond pad 208 of the microelectronic device 202.

In some examples, the offset of the first bond pads 204 and the second bond pads 208 relative to one another may result in the first bond pads 204 and the second bond pads 208 alternating with one another with distance, as measured in a direction parallel to the first shortest distance 216 between adjacent first bond pads 204. For example, one of the first bond pads 204 of a given microelectronic device 202 may be interposed between each adjacent pair of the second bond pads 208 and one of the second bond pads 208 may be interposed between each adjacent pair of the first bond pads 204, with distance along a direction parallel to the first shortest distance 216 between adjacent first bond pads 204. More specifically, as distance along a direction parallel to the first shortest distance 216 between adjacent first bond pads 204 increases, a first bond pad 204 or second bond pad 208 intersected by a line perpendicular to the first shortest distance 216 between adjacent first bond pads 204 may alternate between a given first bond pad 204 proximate to the first side 206 and a given second bond pad 208 proximate to the second side 210.

The first shortest distance 216 between adjacent first bond pads 204 may be greater than a greatest first width 218 of each one of the first bond pads 204, as measured in the direction parallel to the first shortest distance 216 in some examples. For example, the first shortest distance 216 between adjacent first bond pads 204 may be between about 1.1 times and about 10 times the greatest first width 218 of each one of the first bond pads 204. More specifically, the first shortest distance 216 between adjacent first bond pads 204 may be, for example, between about 1.5 times and about 7.5 times the greatest first width 218 of each one of the first bond pads 204. As a specific, nonlimiting example, the first shortest distance 216 between adjacent first bond pads 204 may be between about 2 times and about 5 times (e.g., about 2.5 times, about 3 times, about 4 times) the greatest first width 218 of each one of the first bond pads 204. In some examples, the spacing between adjacent second bond pads 208 may be at least substantially the same as, though offset from, the spacing for the first bond pads 204. For example, a second shortest distance 220 between adjacent second bond pads 208 may be greater than a greatest second width 222 of each one of the second bond pads 208, as measured in the direction parallel to the first shortest distance 216.

In some examples, the microelectronic device 202 may include bond pads proximate to, and extending along, more than two sides of the microelectronic device 202. For example, microelectronic device 202 may include third bond pads 224 located proximate to, and distributed along, a third side 226 of the microelectronic device 202. The third side 226 may extend between the first side 206 and the second side 210. The third side 226 may be, for example, perpendicular to, and intersect with, each of the first edge 212 and the second edge 214. As another example, the microelectronic device 202 may include fourth bond pads 228 located proximate to, and distributed along, a fourth side 230 of the microelectronic device 202. The fourth side 230 may be located opposite the third side 226. For example, the fourth side 230 may likewise be, for example, perpendicular to, and intersect with, each of the first edge 212 and the second edge 214. In some examples, the microelectronic device 202 may include bond pads proximate to, and extending along, each side of the microelectronic device 202. For example, the microelectronic device 202 may include the third bond pads 224 located proximate to, and distributed along, the third side 226 of the microelectronic device 202 and the fourth bond pads 228 located proximate to, and distributed along, the fourth side 230 of the microelectronic device 202.

One of the third bond pads 224 may be at least substantially aligned with a corresponding one of the fourth bond pads 228 in another direction at least substantially parallel to the first shortest distance 216 in some examples where the microelectronic device 202 includes the third bond pads 224 and the fourth bond pads 228. For example, a majority of the third bond pads 224 may be aligned with corresponding ones of the fourth bond pads 228, representing a majority of the fourth bond pads 228 in the direction parallel to the first shortest distance 216. More specifically, all but one of the third bond pads 224 may be aligned with corresponding ones of the fourth bond pads 228, with the remaining third bond pad 224 being aligned with the second bond pads 208 and a remaining fourth bond pad 228 being aligned with the first bond pads 204 in the direction parallel to the first shortest distance 216.

A first pitch of the first bond pads 204 may be greater than a third pitch of the third bond pads 224 in those examples where the microelectronic device 202 includes the third bond pads 224. For example, the first shortest distance 216 between adjacent first bond pads 204 may be between about 1.1 times and about 10 times a third shortest distance 232 between adjacent third bond pads 224. More specifically, the first shortest distance 216 between adjacent first bond pads 204 may be, for example, between about 1.5 times and about 7.5 times the third shortest distance 232 between adjacent third bond pads 224. As a specific, nonlimiting example, the first shortest distance 216 between adjacent first bond pads 204 may be between about 2 times and about 5 times (e.g., about 2.5 times, about 3 times, about 4 times) the third shortest distance 232 between adjacent third bond pads 224.

The first pitch of the first bond pads 204 may also be greater than a fourth pitch of the fourth bond pads 228 in those examples where the microelectronic device 202 includes the fourth bond pads 228. For example, the first shortest distance 216 between adjacent first bond pads 204 may be between about 1.1 times and about 10 times a fourth shortest distance 234 between adjacent fourth bond pads 228. More specifically, the first shortest distance 216 between adjacent first bond pads 204 may be, for example, between about 1.5 times and about 7.5 times the fourth shortest distance 234 between adjacent fourth bond pads 228. As a specific, nonlimiting example, the first shortest distance 216 between adjacent first bond pads 204 may be between about 2 times and about 5 times (e.g., about 2.5 times, about 3 times, about 4 times) the fourth shortest distance 234 between adjacent fourth bond pads 228.

The microelectronic device 202 may include, for example, a die 236 bearing circuitry connected to the bond pads, with the bond pads being used to connect the circuitry of the die 236 to higher-level packaging. For example, the microelectronic device 202 may include a die 236 having a first major surface 238 (e.g., an active surface) at which the first bond pads 204, the second bond pads 208, any third bond pads 224, and any fourth bond pads 228 may be at least temporarily exposed for connecting the microelectronic device 202 to higher-level packaging (any bond pads may subsequently be covered by, for example, an encapsulant material). More specifically, the microelectronic device 202 may include, for example, a die 236 including a semiconductor material having integrated circuitry connected to the bond pads of the microelectronic device 202.

At least some of the first bond pads 204 and the second bond pads 208 may be configured for connection to a reference voltage in some examples. For example, the microelectronic device 202 may be supported on a substrate 240, and the first bond pads 204 and the second bond pads 208 may be connected to respective lands 242 of the substrate 240, which may in turn be connected to a power source. More specifically, the microelectronic device 202 may be interposed between at least two rows of lands 242, the first bond pads 204 may be connected to lands 242 located proximate to the first side 206 of the microelectronic device 202 by first wire bonds 244, and the second bond pads 208 may be connected to lands 242 located proximate to the second side 210 of the microelectronic device 202 by second wire bonds 246. As a specific, nonlimiting example, one of the first bond pads 204 or the second bond pads 208 may be connected to one of a positive or a negative terminal of a power source via the lands 242 proximate to the first side 206, or the second side 210 and the other of the first bond pads 204 or the second bond pads 208 may be connected to the other of the positive or the negative terminal of the power source via the lands 242 proximate to the first side 206 or the second side 210.

In some examples, at least some of the third bond pads 224 and the fourth bond pads 228 may be configured for connection to a data signal or clock channel. For example, the third bond pads 224 and the fourth bond pads 228 may be connected to respective lands 242 of the substrate 240, which may in turn be connected to data signal or clock channel. More specifically, the microelectronic device 202 may be at least substantially surrounded by lands 242, the first bond pads 204 may be connected to lands 242 located proximate to the first side 206 of the microelectronic device 202 by first wire bonds 244, the second bond pads 208 may be connected to lands 242 located proximate to the second side 210 of the microelectronic device 202 by second wire bonds 246, and the third bond pads 224 and fourth bond pads 228 may be connected to lands 242 proximate to the third side 226 and the fourth side 230, respectively, by wire bonds. For the sake of simplicity, the lands and wire bonds for connecting the third bond pads 224 and the fourth bond pads 228 to the substrate 240 are not depicted in FIG. 2. Providing bond pads along multiple sides of a given microelectronic device, including along each side of certain microelectronic devices, may increase the number of available connections, increase signal density, and improve power delivery, enabling microelectronic devices having greater numbers of discrete outputs, requiring greater power throughput, relying on a greater number of different reference voltages, or having any combination of these characteristics.

By segregating the connections to power from the connections to data signal and clock channels, signal quality may be improved. For example, connecting to power from two opposite sides of a microelectronic device 202, and connecting to data signal and clock channel from two other opposite sides of the microelectronic device 202 may reduce the risk of interaction between the power and data signal and clock channels. More specifically, positioning the bond pads of the microelectronic device 202 to generally facilitate routing power in a direction perpendicular to a direction in which data signal and clock channels are routed may reduce interaction between the power and data signal and clock channels, improving signal quality.

The microelectronic device package 200 may include another microelectronic device 248 supported on the substrate 240 with the microelectronic device 202 in some examples. The other microelectronic device 248 may be configured at least substantially similar to the microelectronic device 202, insofar as position and distribution of bond pads may be concerned. For example, the other microelectronic device 248 may include other first bond pads 250 located proximate to, and distributed along, another first side 252 of the other microelectronic device 248. Other second bond pads 254 may be located proximate to, and distributed along, another second, opposite side 256 of the other microelectronic device 248.

The other first bond pads 250 and the other second bond pads 254 may be offset from one another in a direction parallel to another first shortest distance 258 between adjacent other first bond pads 250. For example, a line extending perpendicular to the other first shortest distance 258 between adjacent other first bond pads 250, and intersecting a geometric center of a given other first bond pad 250 or other second bond pad 254, may not intersect with a geometric center of any other first bond pad 250 or other second bond pad 254 of the other microelectronic device 248. More specifically, a line extending perpendicular to the other first shortest distance 258 between adjacent other first bond pads 250, and intersecting a geometric center of a given other first bond pad 250 or other second bond pad 254, may not intersect with any other first bond pad 250 or other second bond pad 254 of the other microelectronic device 248. As a specific, nonlimiting example, a line extending perpendicular to the other first shortest distance 258 between adjacent other first bond pads 250, and intersecting a given other first bond pad 250 or other second bond pad 254 at any point, may not intersect with any other other first bond pad 250 or other second bond pad 254 of the other microelectronic device 248.

In some examples, the offset of the other first bond pads 250 and the other second bond pads 254 relative to one another may result in the other first bond pads 250 and the other second bond pads 254 alternating with one another with distance, as measured in a direction parallel to the other first shortest distance 258 between adjacent other first bond pads 250. For example, one of the other first bond pads 250 of the other microelectronic device 248 may be interposed between each adjacent pair of the other second bond pads 254 and one of the other second bond pads 254 may be interposed between each adjacent pair of the other first bond pads 250, with distance along a direction parallel to the other first shortest distance 258 between adjacent other first bond pads 250. More specifically, as distance along a direction parallel to the other first shortest distance 258 between adjacent other first bond pads 250 increases, an other first bond pad 250 or other second bond pad 254 intersected by a line perpendicular to the other first shortest distance 258 between adjacent other first bond pads 250 may alternate between a given other first bond pad 250 proximate to the other first side 252 and a given other second bond pad 254 proximate to the other second side 256.

The other microelectronic device 248 may include, for example, another die 276 bearing circuitry connected to the bond pads, with the bond pads being used to connect the circuitry of the other die 276 to higher-level packaging. For example, the other microelectronic device 248 may include another die 276 having another major surface 278 (e.g., an active surface) at which the other first bond pads 250, the other second bond pads 254, any other third bond pads 266, and any other fourth bond pad 268 may be at least temporarily exposed for connecting the other microelectronic device 248 to higher-level packaging (any bond pads may subsequently be covered by, for example, an encapsulant material). More specifically, the other microelectronic device 248 may include, for example, another die 276 including a semiconductor material having integrated circuitry connected to the bond pads of the other microelectronic device 248.

In some examples, some of the first bond pads 204 of the microelectronic device 202 may be interposed between corresponding ones of the other second bond pads 254 of the other microelectronic device 248 in the direction parallel with the first shortest distance between adjacent first bond pads 204, or some of the second bond pads 208 of the microelectronic device 202 may be interposed between corresponding ones of the other first bond pads 250 of the other microelectronic device 248. As shown in FIG. 2, the second side 210 of the microelectronic device 202 may face, and be located proximate to, the other first side 252 of the other microelectronic device 248. As distance along the direction parallel to the first shortest distance 216 between adjacent first bond pads 204 increases, a line perpendicular to the first shortest distance 216 between adjacent first bond pads 204 may alternate between intersecting a given second bond pad 208 proximate to the second side 210 and a given other first bond pad 250 proximate to the other first side 252.

Each successive land 242 interposed between the microelectronic device 202 and the other microelectronic device 248 may likewise be connected to an alternating one of the second bond pads 208 or the other first bond pads 250. For example, a single row of mutually aligned lands 242 may be located between the microelectronic device 202 and the other microelectronic device 248, and alternating ones of the second wire bonds 246 or the other first wire bonds 260 may extend from successive lands 242 to corresponding alternating ones of the second bond pads 208 or the other first bond pads 250.

In some examples, alternating ones of the lands 242 may be configured for connection to alternating ones of the positive or negative terminals of a power source. For example, those lands 242 connected to the second bond pads 208 of the microelectronic device 202 proximate to the second edge 214 may be configured to connect to one of the positive or negative terminal of a power source, and those lands 242 connected to the other first bond pads 250 of the other microelectronic device 248 proximate to the other first edge 272 may be configured to connect to the other of the positive or negative terminal of the power source. Those lands 242 connected to the first bond pads 204 of the microelectronic device 202 proximate to the first edge 212 may also be configured to connect to the other of the positive or negative terminal of the power source, completing a power circuit for the microelectronic device 202. Those lands 242 connected to the other second bond pads 254 of the fourth bond pad 228 proximate to the other second edge 274 may be configured to connect to the one of the positive or negative terminal of the power source, completing a power circuit for the other microelectronic device 248.

The first bond pads 204 of the microelectronic device 202 may be at least substantially aligned with the other first bond pads 250 of the other microelectronic device 248 along the direction parallel to the first shortest distance 216 between adjacent first bond pads 204, and the second bond pads 208 of the microelectronic device 202 may be at least substantially aligned with the other second bond pads 254 of the other microelectronic device 248 along the same direction. For example, a line perpendicular to the first shortest distance 216 between adjacent first bond pads 204, and intersecting a given first bond pad 204, may also intersect with a corresponding one of the other first bond pads 250. More specifically, for each first bond pad 204, a line perpendicular to the first shortest distance 216 between adjacent first bond pads 204, and intersecting a given first bond pad 204, may also intersect with a corresponding one of the other first bond pads 250. Continuing the example, the line perpendicular to the first shortest distance 216 between adjacent first bond pads 204, and intersecting a given second bond pad 208, may also intersect with a corresponding one of the other second bond pads 254. More specifically, for each second bond pad 208, the line perpendicular to the first shortest distance 216 between adjacent first bond pads 204, and intersecting a given second bond pad 208, may also intersect with a corresponding one of the other second bond pads 254.

The other first wire bonds 260 may extend from the other first bond pads 250 of the other microelectronic device 248 in a first direction, and second wire bonds 246 may extend from the second bond pads 208 of the microelectronic device 202 in a second, opposite direction. The other first wire bonds 260 and the second wire bonds 246 may extend to corresponding lands 242 of the substrate 240 interposed between the microelectronic device 202 and the other microelectronic device 248. The other first wire bonds 260 may alternate with the second wire bonds 246 along the direction parallel to the first shortest distance 216 between the adjacent first bond pads 204. As distance along the direction parallel to the first shortest distance 216 between adjacent first bond pads 204 increases, for example, a line perpendicular to the first shortest distance 216 between adjacent first bond pads 204 may alternate between intersecting a given other first wire bond 260 or a given second wire bond 246.

A first pitch of the first bond pads 204 of the microelectronic device 202 may be greater than a second pitch of the lands 242 of the substrate 240 located between the microelectronic device 202 and the other microelectronic device 248. For example, the first shortest distance 216 between adjacent first bond pads 204 may be between about 1.5 times and about 5 times a fifth shortest distance 262 between adjacent lands 242 located between the microelectronic device 202 and the other microelectronic device 248. More specifically, the first shortest distance 216 between adjacent first bond pads 204 may be, for example, between about 2 times and about 4 times the fifth shortest distance 262 between adjacent lands 242 located between the microelectronic device 202 and the other microelectronic device 248. As a specific, nonlimiting example, the first shortest distance 216 between adjacent first bond pads 204 may be about 3 times the fifth shortest distance 262 between adjacent lands 242 located between the microelectronic device 202 and the other microelectronic device 248.

Like the first bond pads 204 and the second bond pads 208 of the microelectronic device 202, at least some of the other first bond pads 250 and the other second bond pads 254 may be configured for connection to a reference voltage via the lands 242 of the substrate 240. For example one of the other first bond pads 250 or the other second bond pads 254 may be configured to connect to a reference voltage via lands 242 interposed between the microelectronic device 202 and or the other microelectronic device 248, and the other of the other first bond pads 250 or the other second bond pads 254 may be configured to connected to a reference voltage via lands 242 on a side of the other microelectronic device 248 opposite the microelectronic device 202. More specifically, the other first bond pads 250 may be configured to connect to a reference voltage via lands 242 on the other first side 252 of the other microelectronic device 248, and the other second bond pads 254 may be configured to connected to a reference voltage via lands 242 on the other second side 256 of the other microelectronic device 248.

Distances between offset bond pads of the microelectronic device 202 and the other microelectronic device 248 may be greater than the sizes of the lands 242 in at least some directions. For example, a second shortest distance 220 between adjacent second bond pads 208 of the microelectronic device 202 may be greater than a greatest other width 264 of each one of the lands 242, as measured in the direction parallel to the first shortest distance 216 between adjacent first bond pads 204. More specifically the second shortest distance 220 between adjacent second bond pads 208 may be between about 1.5 times and about 5 times a greatest other width 264 of the lands 242. As a specific, nonlimiting example, the second shortest distance 220 between adjacent second bond pads 208 may be, for example, between about 2 times and about 4 times (e.g., about 3 times) the greatest other width 264 of the lands 242.

Positioning the bond pads of the microelectronic device 202 and the other microelectronic device 248, and the lands 242 of the substrate 240, in accordance with this disclosure may enable wire bonds to take a more direct path from the bond pads to the lands 242. For example, the other first wire bonds 260 may extend at least substantially perpendicular to the other first edge 272 of the other microelectronic device 248, the other first edge 272 located proximate to the other first bond pads 250. The second wire bonds 246 may also extend at least substantially perpendicular to a second edge 214 of the microelectronic device 202, the second edge 214 located proximate to proximate to the second bond pads 208.

In some examples, the microelectronic device 202 and the other microelectronic device 248 may be free of wire bonds crossing one another. For example, the first wire bonds 244 extending between respective ones of the first bond pads 204 and the lands 242 may not cross one another, or any other wire bonds of the microelectronic device package 200, when viewed in a direction perpendicular to the first major surface 238 of the microelectronic device 202. Similarly, the second wire bonds 246 extending between respective ones of the second bond pads 208 and the lands 242, the other first wire bonds 260 extending between respective ones of the other first bond pads 250 and the lands 242, and the other second wire bonds 270 extending between respective ones of the other second bond pads 254 and the lands 242 may not cross one another, or any other wire bonds of the microelectronic device package 200, when viewed in a direction perpendicular to the first major surface 238 of the microelectronic device 202. Layouts for bond pads and associated lands in accordance with this disclosure may enable more direct pathing for wire bonds extending therebetween, reducing the risk of undesirable contact between wire bonds themselves or between the wire bonds and other structures within the package (e.g., with the microelectronic devices).

The bond pads of the microelectronic device package 200 (e.g., first bond pads 204, second bond pads 208, other first bond pads 250, other second bond pads 254) may be configured as discrete regions of electrically conductive material connected to circuitry of the relevant microelectronic device 202 or other microelectronic device 248 and positioned for connection to higher-level packaging. For example, the bond pads of the microelectronic device package 200 may include surfaces of electrically conductive material (e.g., copper, aluminum, gold, tin, lead, alloys and mixtures including the foregoing) supported on the die 236 of the microelectronic device 202 or the other die 276 of the other microelectronic device 248. More specifically, the bond pads of the microelectronic device package 200 may be formed in uppermost layers of an interconnect structure of each of the die 236 of the microelectronic device 202 and the other die 276 of the other microelectronic device 248.

The lands 242 of the substrate 240 may similarly be configured as discrete regions of electrically conductive material connected to routing connections of the substrate 240. For example, the lands 242 of the substrate 240 may include surfaces of electrically conductive material (e.g., copper, aluminum, gold, tin, lead, alloys and mixtures including the foregoing) supported on the substrate 240. More specifically, the lands 242 of the substrate 240 may be located on a side facing the microelectronic devices of the microelectronic device package 200, and the substrate 240 may include, for example, redistribution layers, electrically conductive vias, traces, and other electrically conductive routing connections for routing power, data signal, and clock channels to and from the microelectronic devices.

The wire bonds of the microelectronic device package 200 (e.g., first wire bonds 244, second wire bonds 246, other first wire bonds 260, other second wire bonds 270, wire bonds for the third bond pads 224, fourth bond pads 228, other third bond pads 266, other fourth bond pads 268) may be configured as elongated masses of electrically conductive material extending between the bond pads and the lands 242 of the microelectronic device package 200. For example, the wire bonds may have a length to width ratio of 10 or higher, and may include electrically conductive material (e.g., copper, aluminum, gold, tin, lead, alloys and mixtures including the foregoing) for interconnecting the bond pads and the lands 242.

Figure 3:
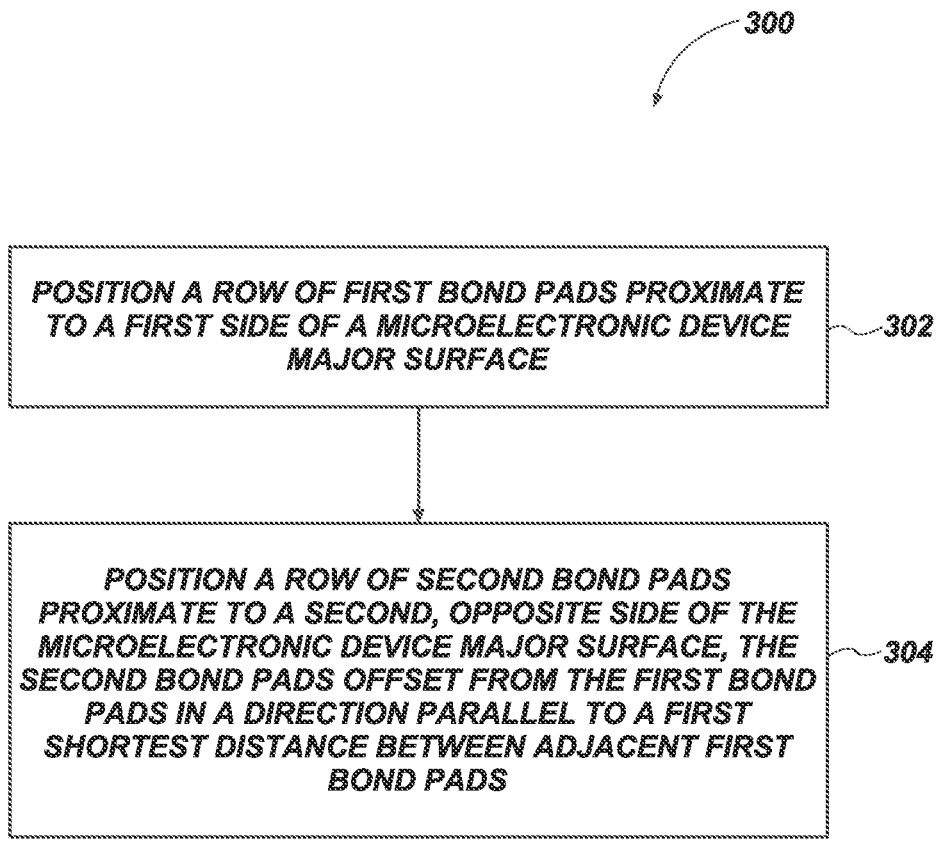
FIG. 3 is a flowchart depicting a method of making a microelectronic device.

FIG. 3 is a flowchart depicting a method 300 of making a microelectronic device. The method 300 may involve, for example, positioning first bond pads proximate to, and distributing the first bond pads along, a first side of the microelectronic device, as indicated at act 302. Second bond pads may be positioned proximate to, and the second bond pads may be distributed along, a second, opposite side of the microelectronic device, as indicated at act 304. The first bond pads and the second bond pads may be offset from one another in a direction parallel to a first shortest distance between adjacent first bond pads, as further indicated at act 304.

In summary, methods of making microelectronic devices may involve, for example, positioning a row of first bond pads at a first pitch proximate to a first side of a microelectronic device major surface. A row of other bond pads may be positioned at another, smaller pitch proximate to another side of the microelectronic device major surface perpendicular to the first side.

Figure 4:
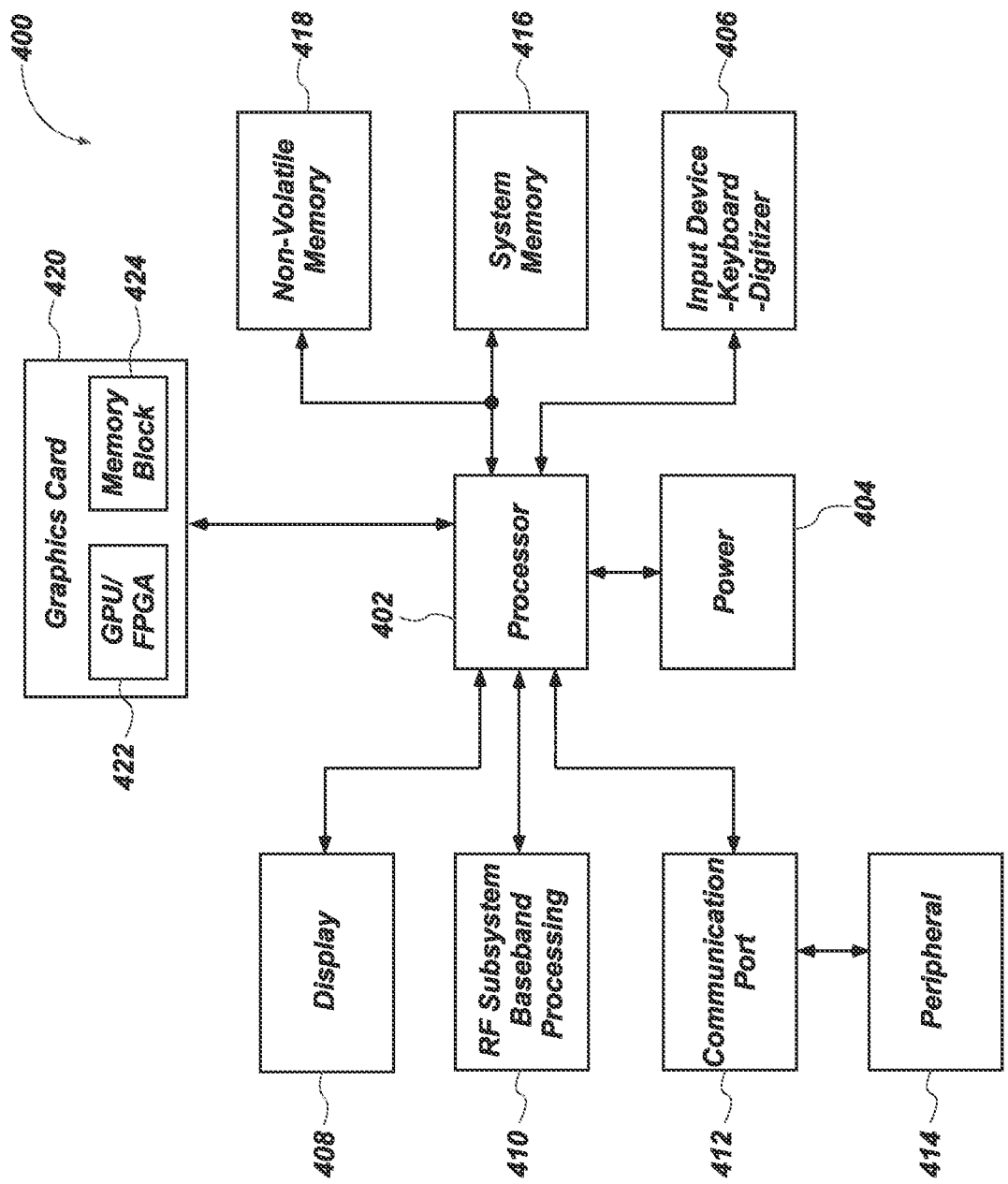
FIG. 4 is a block diagram of an electronic system incorporating one or more microelectronic devices, in accordance with this disclosure.

FIG. 4 is a block diagram of an electronic system 400 incorporating one or more microelectronic devices in accordance with embodiments of the disclosure. The electronic system 400 may include various semiconductor devices manufactured in accordance with embodiments of the present disclosure. For example, the electronic system 400 may be any of a variety of types, such as a computer, tablet, cellular phone, smartphone, control circuit, or other electronic device. The electronic system 400 may include one or more processors 402, such as a microprocessor, to control the processing of system functions and requests in the electronic system 400. In some examples, the processor 402 or processors 402 may include one or more microelectronic device packages 200 (see FIG. 2) in accordance with this disclosure.

The electronic system 400 may include a power supply 404 in operable communication with the processor 402. For example, if the electronic system 400 is a portable system, the power supply 404 may include one or more of a fuel cell, a power scavenging device, permanent batteries, replaceable batteries, and/or rechargeable batteries. The power supply 404 may also include an AC adapter; therefore, the electronic system 400 may be plugged into a wall outlet, for example. The power supply 404 may also include a DC adapter such that the electronic system 400 may be plugged into a vehicle cigarette lighter or a vehicle power port, for example.

Various other devices may be coupled to the processor 402 depending on the functions that the electronic system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the electronic system 400 by implementing software programs stored in memory 416, 418. The software programs may include an operating system, database software, drafting software, word processing software, media editing software, or media playing software, for example. The memory 416, 418 is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM) (e.g., synchronous DRAM (SDRAM) conforming with a double data rate (DDR) and/or graphics DDR (GDDR) standard (DDR4, DDR5, DDR6)), static random access memory (SRAM), racetrack memory, and other known memory types. The system memory 416 may include volatile memory, non-volatile memory, or a combination thereof. The system memory 416 is typically large so that it can store dynamically loaded applications and data.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. In some examples, the system memory 416, non-volatile memory 418, or system memory 416 and non-volatile memory 418 may include one or more microelectronic device packages 200 (see FIG. 2) in accordance with this disclosure.

In some embodiments, the electronic system 400 may include a graphics subsystem, such as a graphics card 420, connected to the processor 402. For example, each of the graphics card 420 and the processor 402 may be connected to, and supported on, a motherboard in their respective sockets (e.g., a peripheral component interconnect express (PCIe) socket for the graphics card 420, a CPU socket for the processor 402). The graphics card 420 may include its own processing device, such as a graphics processing unit (GPU) or field-programmable gate array (FPGA) 422. The GPU or FPGA 422 may be configured to, and may be a dedicated device for, processing graphics-related tasks to accelerate the creation of images in a frame buffer intended for output to the display 408. The graphics card 420 may also include a memory bank, such as, for example, a graphics memory block 424, which may include one or more high-speed memory devices connected to the GPU or FPGA 422 and configured to store and facilitate acceleration of graphics-related data. More specifically, the graphics memory block 424 may include one or more banks of devices configured as dynamic random access memory (DRAM) (e.g., synchronous DRAM (SDRAM) conforming with a double data rate (DDR) and/or graphics DDR (GDDR) standard (GDDR5, GDDR6, GDDR7)). In some examples, the GPU or FPGA 422, the memory block 424, or the GPU or FPGA 422 and the memory block 424 may include one or more microelectronic device packages 200 (see FIG. 2) in accordance with this disclosure.

In summary, systems in accordance with this disclosure may include a processor and a memory device. The processor, the memory device, or the processor and the memory device may include a microelectronic device package, the microelectronic device package including a microelectronic device. The microelectronic device may include first bond pads located proximate to, and extending along at least substantially an entirety of, a first side of the microelectronic device. Other bond pads may be located proximate to, and extend along at least substantially an entirety of, another side of the microelectronic device oriented perpendicular to the first side. A first pitch between bond pads of the first bond pad row may be greater than another pitch of bond pads of the other bond pad row.

Microelectronic devices in accordance with this disclosure may enable greater density of device deployment in tandem with greater density of connections. For example, a single-width row of lands may be connected to multiple microelectronic devices, reducing a lateral footprint of the resulting package and enabling denser microelectronic device deployment in at least some examples.

Microelectronic devices in accordance with this disclosure may also enable more reliable power delivery while improving signal quality. For example, the bond pads of the microelectronic devices may be arranged to segregate power delivery from data signal and clock channels, and to facilitate routing power delivery in a direction at least substantially perpendicular to routing for the data signal and clock channels. The bond pads of the microelectronic devices for connection to power may also reduce the length of connections, reducing resistance.

Microelectronic devices in accordance with this disclosure may further reduce the risk of shorts within packages including the microelectronic devices. For example, the relative positions of the bond pads on the microelectronic device and the lands on a substrate to be connected to one another may enable the wire bonds to extend along an at least substantially direct path from the bond pads to the associated lands, and at least substantially perpendicular to edges of the microelectronic devices when viewed in a direction perpendicular to major surfaces of the microelectronic devices. In addition, the relative positions of the bond pads on the microelectronic device and the lands on a substrate to be connected to one another may enable the wire bonds not to cross paths when extending from the bond pads to the lands. Such a layout for the bond pads, lands, and wire bonds may reduce the risk of shorts between wire bonds or between a wire bond and another portion of the microelectronic device or substrate.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:

1. A microelectronic device, comprising:
   first bond pads located proximate to, and distributed along, a first side of a major surface of the microelectronic device, each bond pad located proximate to, and distributed along, the first side of the major surface of the microelectronic device being a first bond pad;
   other bond pads located proximate to, and distributed along, another, perpendicular side of the major surface of the microelectronic device, each bond pad located proximate to, and distributed along, the other side of the major surface of the microelectronic device being an other bond pad; and
   second bond pads located proximate to, and distributed along, a second side of the major surface of the microelectronic device located opposite the first side;
   wherein a first pitch of the first bond pads is greater than an other pitch of the other bond pads;
   wherein the first pitch of the bond pads is at least substantially equal to a second pitch of the bond pads;
   wherein the first bond pads and the second bond pads are offset from one another in a direction parallel to a first shortest distance between adjacent first bond pads by a pitch one-half of the first pitch of the first bond pads and of the second pitch of the second bond pads.

2. The microelectronic device of claim 1, wherein the first pitch is between about 1.5 times and about 7.5 times greater than the other pitch.

3. The microelectronic device of claim 1, wherein the microelectronic device is supported on a substrate and wherein a second shortest distance between adjacent second bond pads is greater than a greatest other width of each land of the substrate positioned and configured for connection to one of the first bond pads, the second bond pads, or the other bond pads, as measured in the direction parallel to the first shortest distance between adjacent first bond pads.

4. The microelectronic device of claim 1, wherein the first shortest distance between adjacent first bond pads is greater than a greatest first width of each one of the first bond pads, as measured in the direction parallel to the first shortest distance.

5. The microelectronic device of claim 1, wherein a second shortest distance between adjacent second bond pads is greater than a greatest second width of each one of the second bond pads, as measured in the direction parallel to the first shortest distance.

6. The microelectronic device of claim 1, wherein one of the first bond pads is interposed in the parallel direction between each adjacent pair of the second bond pads and one of the second bond pads is interposed between each adjacent pair of the first bond pads.

7. The microelectronic device of claim 1,
   further comprising fourth bond pads located proximate to, and distributed along, a fourth side of the major surface of the microelectronic device, the fourth side located opposite the other side; and
   wherein one or more of the other bond pads is aligned with a corresponding one or more of the fourth bond pads in a direction at least substantially parallel to a first shortest distance between adjacent first bond pads.

8. The microelectronic device of claim 1, wherein:
   at least some of the first bond pads are operably coupled to circuitry of the microelectronic device for connection to a reference voltage; and
   at least some of the other bond pads are operably coupled to circuitry of the microelectronic device for connection to a data signal or clock channel.

9. A method, comprising:

positioning a row of first bond pads at a first pitch proximate to a first side of a microelectronic device major surface, each bond pad positioned proximate to the first side of the microelectronic device major surface being a first bond pad;

positioning a row of other bond pads at another, smaller pitch proximate to another side of the microelectronic device major surface perpendicular to the first side, each bond pad positioned proximate to the other side of the microelectronic device major surface being an other bond pad; and positioning a row of second bond pads at a second pitch at least substantially equal to the first pitch proximate to a second side of the microelectronic device major surface opposite the first side with the first bond pads and the second bond pads offset from one another in a direction parallel to a first shortest distance between adjacent first bond pads by a pitch one-half of the first pitch and of the second pitch.

10. A system, comprising:
a processor; and
a memory device;
wherein one or more of the processor and the memory device comprises a microelectronic device package including a microelectronic device comprising:
a first bond pad row located proximate to, and extending along at least substantially an entirety of, a first side of a major surface of the microelectronic device, each bond pad located proximate to, and extending along at least substantially the entirety of, the first side of the major surface of the microelectronic device being in the first bond pad row;
another bond pad row located proximate to, and extending along at least substantially an entirety of, another side of the major surface of the microelectronic device, the other side oriented perpendicular to the first side, each bond pad located proximate to, and extending along at least substantially the entirety of, the other side of the major surface of the microelectronic device being in the other bond pad row, a first pitch between bond pads of the first bond pad row being greater than an other pitch of bond pads of the other bond pad row; and
a second bond pad row located proximate to, and extending along at least substantially an entirety of a second side of the major surface of the microelectronic device, the second side located opposite the first side;
wherein the first pitch of the bond pads of the first bond pad row is at least substantially equal to a second pitch of the bond pads of the second bond pad row;
wherein bond pads of the first bond pad row and bond pads of the second bond pad row are offset from one another in a direction parallel to the first and second bond pad rows by a pitch one-half of the first pitch between bond pads of the first bond pad row and of the second pitch between bond pads of the second bond pad row.

11. The system of claim 10, wherein the first pitch is between about 1.5 times and about 7.5 times greater than the other pitch.

12. The system of claim 10, wherein the microelectronic device is supported on a substrate and wherein a second shortest distance between adjacent bond pads of the second bond pad row is greater than a greatest other width of each land of the substrate positioned and configured for connection to one of the bond pads of the first bond pad row, the second bond pad row, or the other bond pad row, as measured in the direction parallel to the first and second bond pad rows.

13. The system of claim 10, wherein a first shortest distance between adjacent bond pads of the first bond pad row is greater than a greatest first width of each one of the bond pads of the first bond pad row, as measured in the direction parallel to the first shortest distance.

14. The system of claim 10, wherein a second shortest distance between adjacent bond pads of the second bond pad row is greater than a greatest second width of each one of the bond pads of the second bond pad row, as measured in the direction parallel to the first shortest distance.

15. The system of claim 10, wherein one of the bond pads of the first bond pad row is interposed in the parallel direction between each adjacent pair of bond pads of the second bond pad row and one of the bond pads of the second bond pad row is interposed between each adjacent pair of bond pads of the first bond pad row.

16. The system of claim 10,
further comprising a fourth bond pad row located proximate to, and extending along at least substantially an entirety of, a fourth side of the major surface of the microelectronic device, the fourth side located opposite the other side; and
wherein one or more of the bond pads of the other bond pad row is aligned with a corresponding one or more of the bond pads of the fourth bond pad row in a direction at least substantially parallel to a first shortest distance between adjacent first bond pads.

17. The system of claim 10, wherein:
at least some bond pads of the first bond pad row are operably coupled to circuitry of the microelectronic device for connection to a reference voltage; and
at least some bond pads of the other bond pad row are operably coupled to circuitry of the microelectronic device for connection to a data signal or clock channel.

18. The system of claim 10, wherein the microelectronic device package is free of wire bonds crossing one another.

19. The system of claim 10, wherein a first shortest distance between adjacent bond pads of the first bond pad row, as measured in the direction parallel to the first and second bond pad rows, is between about 1.1 times and about 10 times a greatest first width of each bond pad of the first bond pad row, as measured in a direction perpendicular to the first and second bond pad rows.

20. The system of claim 10, wherein a line extending perpendicular to the first bond pad row, and intersecting a given bond pad of the first bond pad row, does not intersect with any bond pad of the second bond pad row.

* * * * *